United States Patent
Won et al.

(10) Patent No.: US 9,793,864 B2
(45) Date of Patent: Oct. 17, 2017

(54) VOLTAGE DETECTING CIRCUIT AND POWER AMPLIFIER

(71) Applicant: Samsung Electro-Mechanics Co., Ltd., Suwon-si (KR)

(72) Inventors: Jun Goo Won, Suwon-si (KR); Youn Suk Kim, Suwon-si (KR); Ki Joong Kim, Suwon-si (KR); Da Hye Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/994,515

(22) Filed: Jan. 13, 2016

(65) Prior Publication Data

US 2016/0276988 A1 Sep. 22, 2016

(30) Foreign Application Priority Data

Mar. 16, 2015 (KR) ........................ 10-2015-0035844

(51) Int. Cl.
*H03F 3/19* (2006.01)
*G01R 19/00* (2006.01)
*G01R 19/22* (2006.01)
*H03F 1/32* (2006.01)
*H03F 3/24* (2006.01)

(52) U.S. Cl.
CPC .......... *H03F 3/19* (2013.01); *G01R 19/0084* (2013.01); *G01R 19/22* (2013.01); *H03F 1/32* (2013.01); *H03F 3/245* (2013.01); *H03F 2200/207* (2013.01); *H03F 2200/451* (2013.01); *H03F 2200/471* (2013.01)

(58) Field of Classification Search
CPC ........................................................ H03F 3/19
USPC ........................................................ 330/297
See application file for complete search history.

(56) References Cited

U.S. PATENT DOCUMENTS

| | | | |
|---|---|---|---|
| 7,271,662 B2* | 9/2007 | Akamine | H03F 1/30 330/133 |
| 7,504,887 B2 | 3/2009 | Masuda et al. | |
| 8,193,859 B1* | 6/2012 | Hietala | H03G 3/3042 330/140 |
| 8,306,490 B2* | 11/2012 | Tanoue | H03F 1/0261 330/10 |
| 2004/0235436 A1* | 11/2004 | Chao | H03G 3/3042 455/126 |
| 2007/0069820 A1* | 3/2007 | Hayata | H03F 1/301 330/298 |
| 2008/0116970 A1* | 5/2008 | Asam | H03G 3/3042 330/129 |

(Continued)

FOREIGN PATENT DOCUMENTS

KR 1996-7000572 A 1/1996
WO WO 95/13662 A1 5/1995

*Primary Examiner* — Patricia T Nguyen
(74) *Attorney, Agent, or Firm* — NSIP Law

(57) ABSTRACT

A voltage detecting apparatus includes a signal extracting circuit configured to extract a coupled signal from a signal output by a power amplifier configured to amplify a signal output by a radio frequency (RF) circuit, and a voltage detecting circuit configured to detect a detection voltage from the coupled signal and provide the detection voltage to the RF circuit. The voltage detecting circuit configured to vary the detection voltage in response to an input control signal.

23 Claims, 10 Drawing Sheets

(56) References Cited

U.S. PATENT DOCUMENTS

| | | | |
|---|---|---|---|
| 2012/0157020 A1* | 6/2012 | Sasaki | H03F 1/0233 |
| | | | 455/127.1 |
| 2012/0252520 A1* | 10/2012 | Xu | H03G 3/3047 |
| | | | 455/522 |
| 2015/0042405 A1* | 2/2015 | Kim | H03G 3/3042 |
| | | | 330/279 |

* cited by examiner

VOLTAGE DETECTING CIRCUIT AND POWER AMPLIFIER

CROSS-REFERENCE TO RELATED APPLICATION

This application claims the benefit under 35 U.S.C. 119(a) of Korean Patent Application No. 10-2015-0035844 filed on Mar. 16, 2015, in the Korean Intellectual Property Office, the entire disclosure of which is incorporated herein by reference for all purposes.

BACKGROUND

1. Field

The present disclosure relates to a voltage detecting circuit and a power amplifier.

2. Description of Related Art

In general, power amplifiers that may be employed in wireless communications devices such as cellular phones, or the like, require a voltage detecting circuit detecting a level of output power and providing a detection voltage according to the output. The detection voltage from the voltage detecting circuit may be input to an RF IC.

Using the detection voltage, an input of the power amplifier may be adjusted to adjust an output thereof.

Such a feedback loop system may use characteristics of a linear power amplifier exhibiting linear output characteristics with respect to an input.

In general, since detection voltages corresponding to requested output power are different according to types of RF ICs, power amplifiers having different characteristics are required according to types of RF IC, and thus, power amplifiers should be developed for types of RF IC.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a voltage detecting apparatus includes a signal extracting circuit configured to extract a coupled signal from a signal output by a power amplifier. The power amplifier is configured to amplify a signal output by a radio frequency (RF) circuit. A voltage detecting circuit is configured to detect a detection voltage from the coupled signal and provide the detection voltage to the RF circuit, wherein the voltage detecting circuit varies the detection voltage in response to a control signal input to the voltage detecting circuit.

The voltage detecting circuit may include a bias circuit configured to divide a reference voltage through at least two dividing resistors to provide a bias voltage, a resistance level of at least one of the at least two dividing resistors being varied in response to the control signal; a rectifier biased by the bias voltage and configured to rectify a voltage of the coupled signal and to provide the rectified voltage; and a filter configured to filter the rectified voltage and to provide the detection voltage.

The voltage detecting circuit may include a bias circuit configured to divide a reference voltage through at least two dividing resistors to provide a bias voltage; a rectifier biased by the bias voltage to rectify a voltage of the coupled signal and to provide the rectified voltage; and a filter configured to filter the rectified voltage through at least two filter elements to provide the detection voltage, impedance of at least one of the at least two filter elements being varied in response to a second control signal of the control signal.

The voltage detecting circuit may include a bias circuit configured to divide a reference voltage through at least two dividing resistors to provide a bias voltage, one of the at least two dividing resistors being varied in response to a first control signal of the control signal; a rectifier biased by the bias voltage and configured to rectify a voltage of the coupled signal and to provide the rectified voltage; and a filter configured to filter the rectified voltage through at least two filter elements to provide the detection voltage, one of the at least two filter elements being varied in response to a second control signal of the control signal.

According to another general aspect, a power amplifier apparatus includes a radio frequency (RF) circuit configured to process an input signal; a power amplifier configured to amplify a signal output by the RF circuit; a signal extracting circuit configured to extract a coupled signal from a signal output by the power amplifier; and a voltage detecting circuit configured to detect a detection voltage from the coupled signal and provide the detection voltage to the RF circuit, wherein the voltage detecting circuit is configured to vary the detection voltage in response to a control signal.

According to another general aspect, a power amplifier apparatus includes a radio frequency (RF) circuit configured to process an input signal; a power amplifier configured to amplify a signal output by the RF circuit; a signal extracting circuit configured to extract a coupled signal from a signal output by the power amplifier; a voltage detecting circuit configured to detect a detection voltage from the coupled signal and provide the detection voltage to the RF circuit, and a detection voltage controller configured to provide a control signal for controlling the detection voltage on the basis of power output by the power amplifier, wherein the voltage detecting circuit varies the detection voltage in response to the control signal input to the voltage detecting circuit.

According to another general aspect, a method for controlling a voltage detecting apparatus includes actuating an amplifier to accept an input signal received from an RF circuit and to output an amplified signal; extracting a coupled signal from the amplified signal; detecting a detection voltage from the coupled signal and providing the detection voltage to the RF circuit; and, adaptively varying the detection voltage in response to a control signal input to the voltage detecting circuit.

The method may further include actuating a first comparator to compare the power output by the power amplifier with a first reference value, and outputting the control signal having a voltage level according to the comparison result.

The method may further include dividing a reference voltage through at least two dividing resistors to provide a bias voltage, a resistance level of at least one of the at least two dividing resistors being varied in response to the control signal; rectifying a voltage of the coupled signal and providing the rectified voltage; and filtering the rectified voltage to provide the detection voltage.

The method may be embodied in a non-transitory computer readable medium.

Other features and aspects will be apparent from the following detailed description, the drawings, and the claims.

BRIEF DESCRIPTION OF THE DRAWINGS

The above and other aspects, features and other advantages of the present disclosure will be more clearly understood from the following detailed description taken in conjunction with the accompanying drawings, in which.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
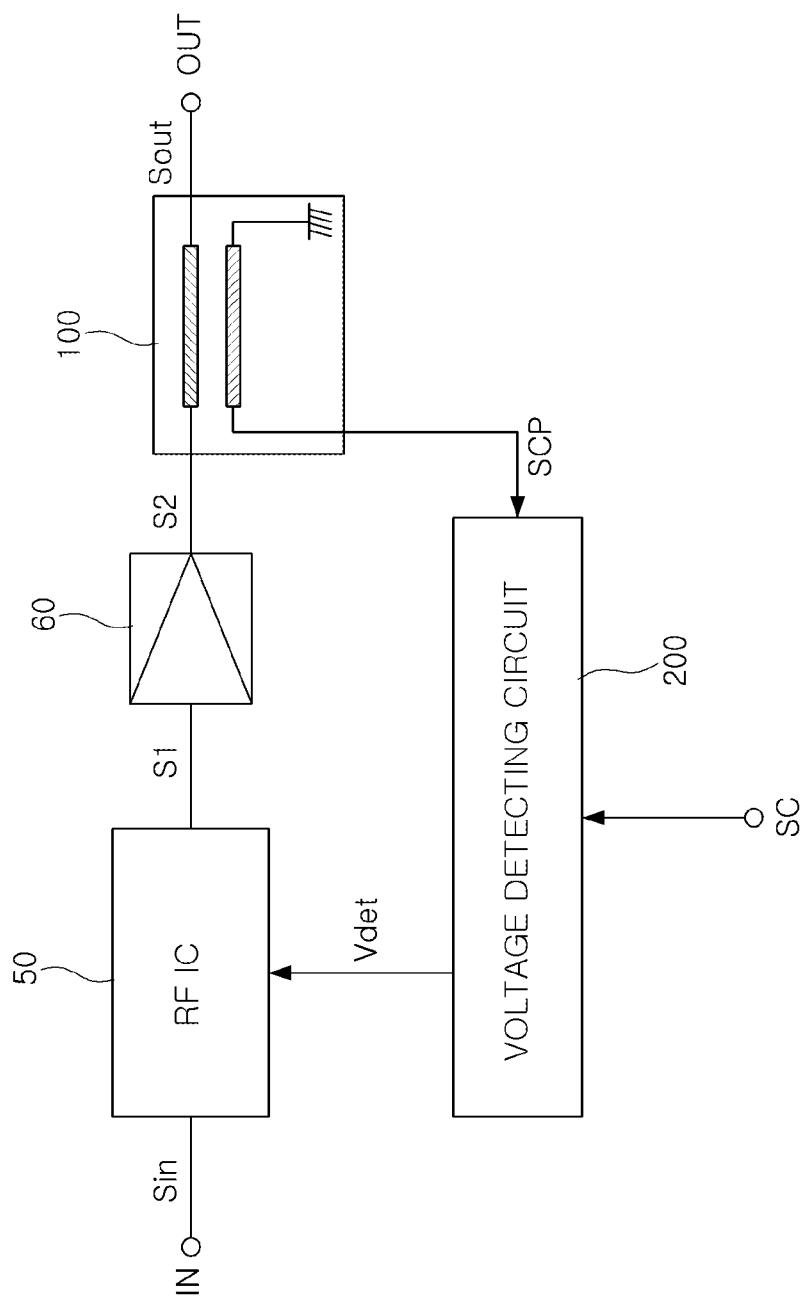
FIG. 1 is a block diagram of a power amplifier according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness. The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the drawings, the same or like reference numerals will be used to designate the same or like elements.

FIG. 1 is a block diagram of a power amplifier according to an embodiment.

Referring to FIG. 1, a power amplifier includes an RF circuit (RF IC) 50, a power amplifier 60, a signal extracting circuit 100, and a voltage detecting circuit 200.

Figure 2:
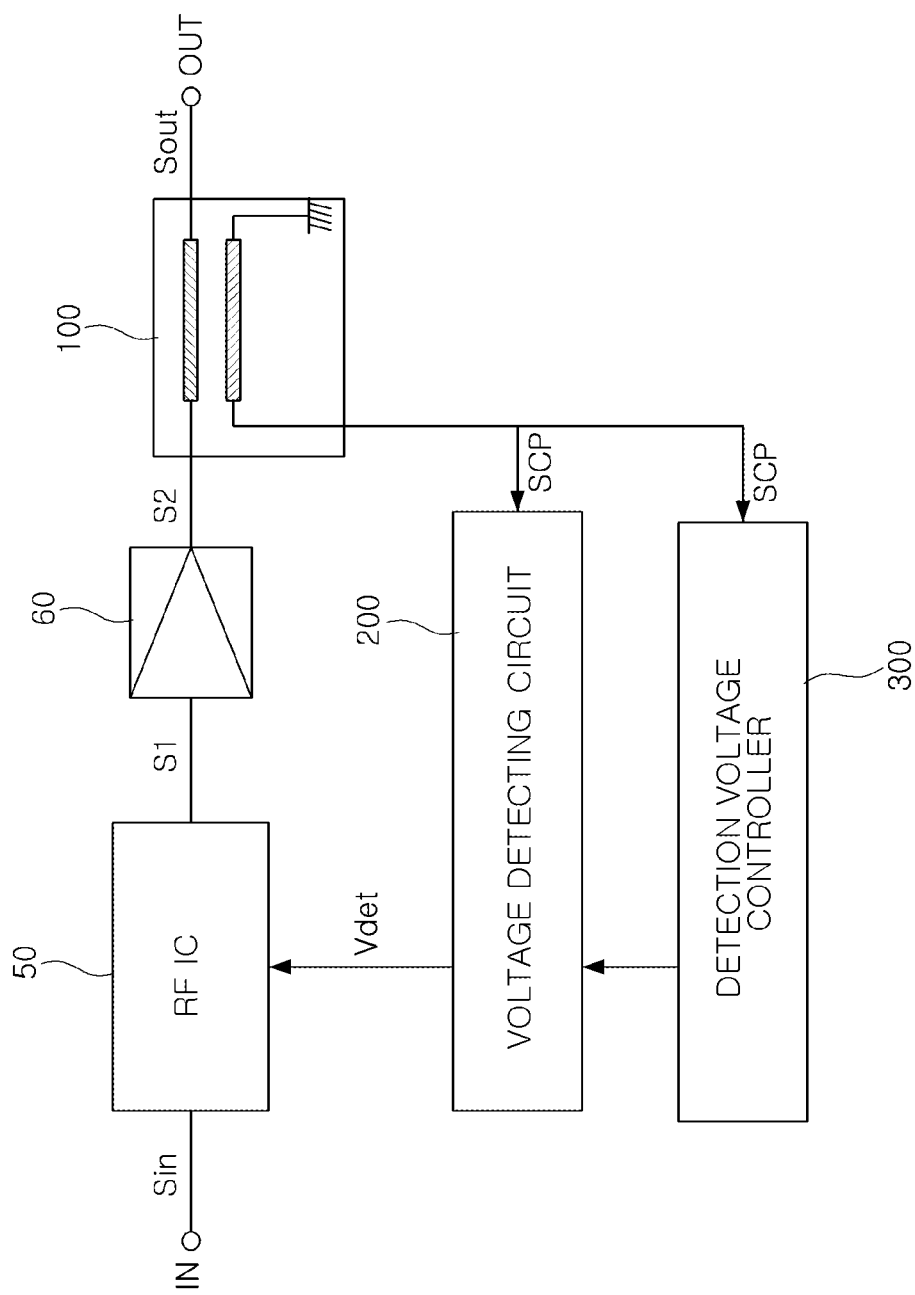
FIG. 2 is a block diagram of a power amplifier according to another configuration.

FIG. 2 is a block diagram of a power amplifier according to another exemplary embodiment.

Referring to FIG. 2, the power amplifier includes an RF circuit 50, a power amplifier 60, a signal extracting circuit 100, a voltage detecting circuit 200, and a detection voltage controller 300.

Referring to FIGS. 1 and 2, the RF circuit 50 may process an input signal Sin. For example, the RF circuit 50 may convert an input signal having a low frequency band into a high frequency signal having a high frequency band.

The power amplifier 60 may amplify an output signal S1 from the RF circuit 50. Here, the output signal S1 from the RF circuit 50 may be an RF signal.

The signal extracting circuit 100 may extract a coupled signal SCP from an output signal S2 from the power amplifier 60. For example, the signal extracting circuit 100 may be a circuit or a component able to extract a portion of a signal. For example, the signal extracting circuit 100 may include a signal coupler coupling a signal using signal coupling or a signal distributor.

The voltage detecting circuit 200 may detect a detection voltage Vdet from the coupled signal SCP and provide the detected detection voltage Vdet to the RF circuit 50. Also, the voltage detection unit 200 may vary the detection voltage Vdet in response to an input control signal SC.

Referring to FIG. 2, the detection voltage controller 300 may provide the control signal SC to control the detection voltage on the basis of power output by the power amplifier 60.

Figure 3:
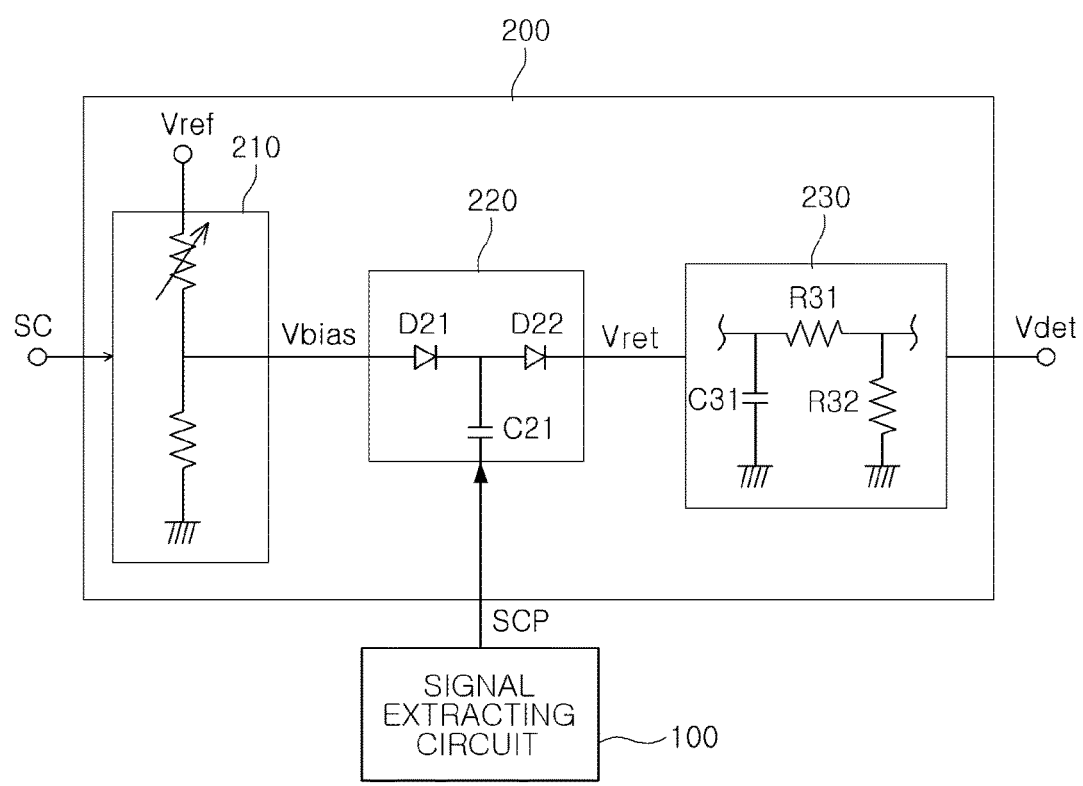
FIG. 3 is a view illustrating a first example of a voltage detecting circuit according to an embodiment.
Figure 4:
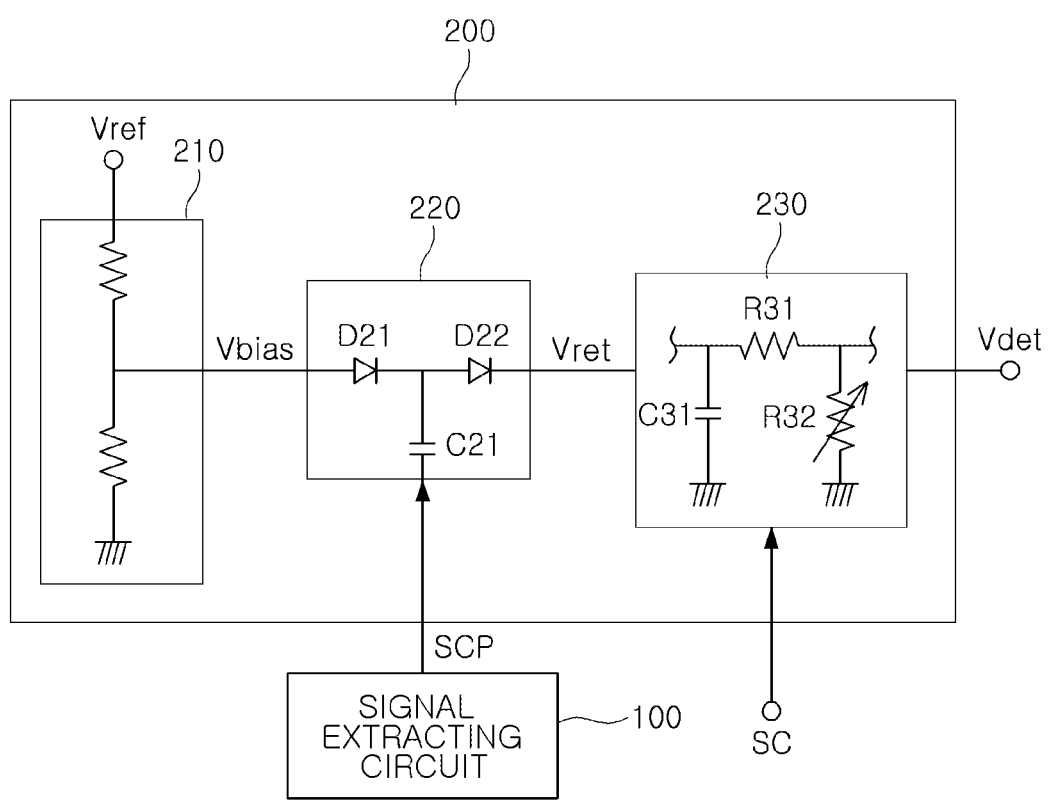
FIG. 4 is a view illustrating a second example of a voltage detecting circuit according to an embodiment.

FIG. 3 is a view illustrating a first example of a voltage detecting circuit according to an embodiment. FIG. 4 is a view illustrating a second example of a voltage detecting circuit according to an embodiment, and FIG. 5 is a view illustrating a third example of a voltage detecting circuit according to an embodiment.

Figure 5:
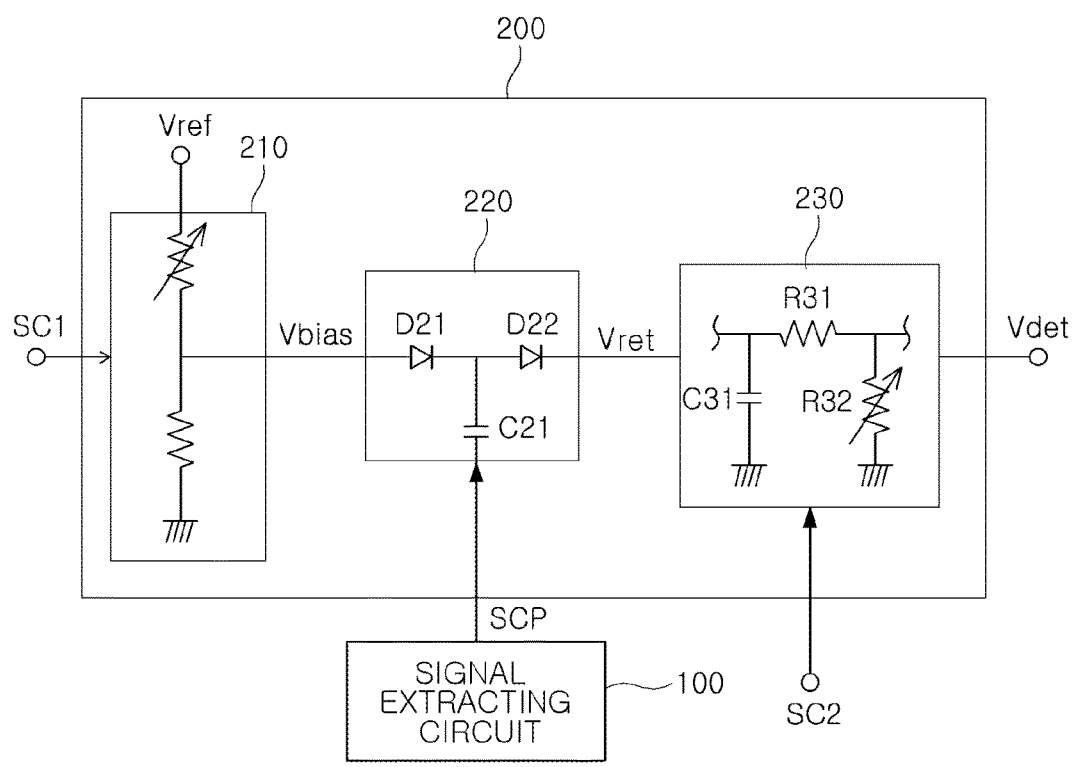
FIG. 5 is a view illustrating a third example of a voltage detecting circuit according to an embodiment.

Referring to FIGS. 3, 4, and 5, the voltage detection circuit 200 includes a bias circuit 210, a rectifier 220, and a filter 230.

The bias circuit 210 may divide a reference voltage Vref through at least two dividing resistors and provide a bias voltage Vbias.

The rectifier 220 may be biased by the bias voltage Vbias to rectify a voltage of the coupled signal SCP to provide a rectified voltage Vret.

For example, the rectifier 220 may include first and second rectifying diodes D21 and D22 connected between the bias circuit 210 and the filter 230 in series in a forward direction, and a capacitor C21 connected between a connection node between the first and second rectifying diodes D21 and D22 and the signal extracting circuit 100.

Here, each of the first and second rectifying diodes D21 and D22 may be biased by the bias voltage Vbias to rectify the coupled signal SCP through the capacitor C21.

The filter 230 may filter the rectified voltage Vret to provide the detection voltage Vdet.

The filter 230 may be configured as a low pass filter including at least two passive elements among a capacitor, an inductor, and a resistor to bypass an alternating current (AC) component included in the rectifying voltage Vret to a ground.

For example, the filter 230 may include a resistor R31 connected between the rectifier 220 and an output terminal of the filter 230 through which the detection voltage Vdet is output, a capacitor C31 connected between one end of the resistor R31 and a ground, and a resistor R32 connected between the other end of the resistor R31 and a ground.

Referring to FIG. 3, in the bias circuit 210, a resistance level of at least one of the at least two dividing resistors may be varied in response to the control signal SC.

For example, in FIG. 3, when the bias voltage Vbias is provided from an intermediate node between the two dividing resistors connected between a supply terminal of the reference voltage Vref and a ground, the resistor connected to the supply terminal of the reference voltage Vref, among the two resistors, may be configured as a variable resistor having a resistance level varied according to a control voltage. The variable resistor may be controlled by a processor, controller, or other logic which adaptively sets the control voltage according to a number of considerations, for example, at least one of Vdet feedback, operational parameters of the RF circuit 50, or combinations thereof.

Figure 9:
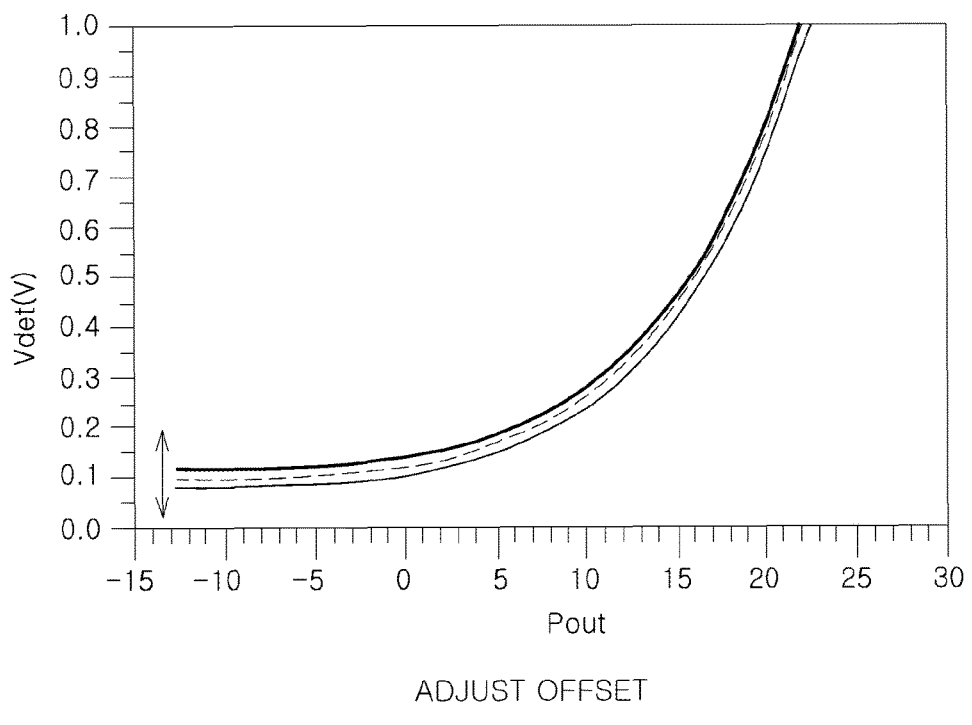
FIG. 9 is a graph illustrating a Vdet-Pout relationship according to offset adjustment according to an embodiment.

In this manner, when a resistance level of at least one of the at least two dividing resistors is varied in the bias circuit 210, an offset with regard to the detection voltage Vdet may be adjusted as illustrated in the detection voltage Vdet-output power Pout graph illustrated in FIG. 9.

Referring to FIG. 4, in the filter 230, impedance of at least one of the at least two filter elements may be varied in response to a second control signal SC2 of the control signal SC.

For example, when the filter 230 includes a resistor R31 connected between the rectifier 220 and an output terminal of the filter 230 through which the detection voltage Vdet is output, a capacitor C31 connected between one end of the resistor R31 and a ground, and a resistor R32 connected between the other end of the resistor R31 and a ground, the resistor R32 may be configured as a variable resistor having a resistance level varied according to the control voltage.

Figure 10:
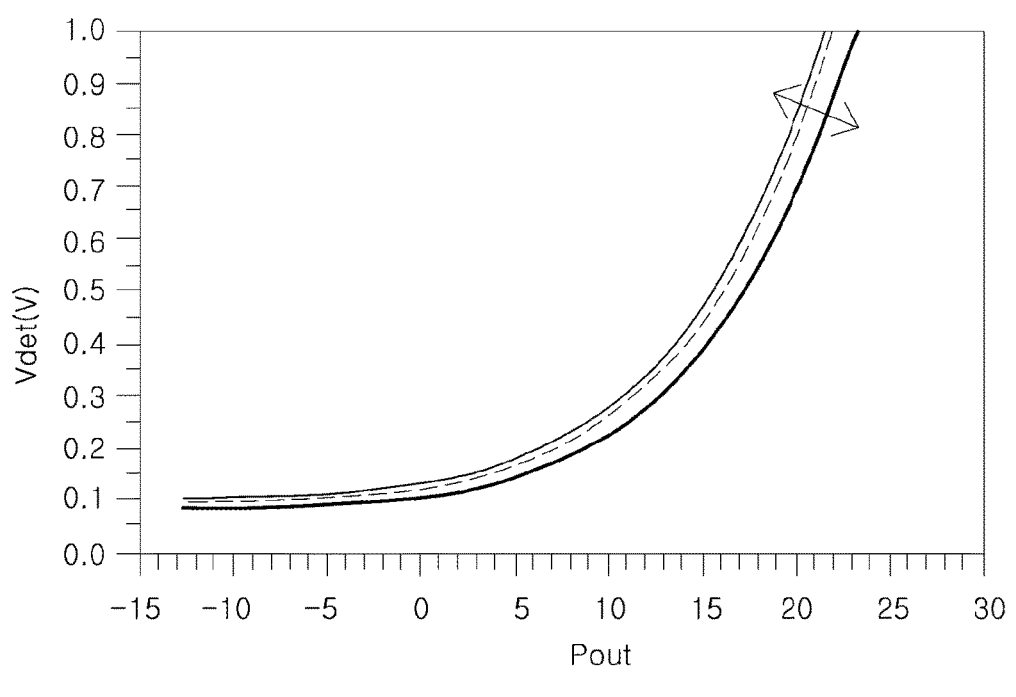
FIG. 10 is a graph illustrating a Vdet-Pout relationship according to gradient adjustment according to an embodiment.

In this manner, in a case in which impedance of at least one of the at least two filter elements is varied in the filter 230, a gradient of the detection voltage Vdet may be adjusted as illustrated in the detection voltage (Vdet)-output power (Pout) graph illustrated in FIG. 10.

Referring to FIG. 5, in the bias circuit 210, one of the at least two dividing resistors may be varied in response to a first control signal SC1 of the control signal SC.

For example, in FIG. 3, when the bias voltage Vbias is provided from the intermediate node between the two dividing resistors connected between the supply terminal of the reference voltage Vref and the ground, the resistor connected to the supply terminal of the reference voltage Vref, among the two resistors, may be configured as a variable resistor having a resistance level varied according to the first control voltage SC1.

In this manner, when a resistance level of at least one of the at least two dividing resistors is varied in the bias circuit 210, an offset regarding the detection voltage Vdet may be adjusted as illustrated in the detection voltage Vdet-output power Pout graph illustrated in FIG. 9.

In the filter 230, one of the at least two passive elements may be varied in response to the second control signal SC2 of the control signal SC.

For example, when the filter 230 includes the resistor R31 connected between the rectifier 220 and an output terminal of the filter 230 through which the detection voltage Vdet is output, the capacitor C31 connected between one end of the resistor R31 and the ground, and the resistor R32 connected between the other end of the resistor R31 and the ground, the resistor R32 may be configured as a variable resistor having a resistance level varied according to the second control voltage SC2.

In this manner, in a case in which impedance of at least one of the at least two filter elements is varied in the filter 230, a gradient of the detection voltage Vdet may be adjusted as illustrated in the detection voltage (Vdet)-output power (Pout) graph illustrated in FIG. 10.

Figure 6:
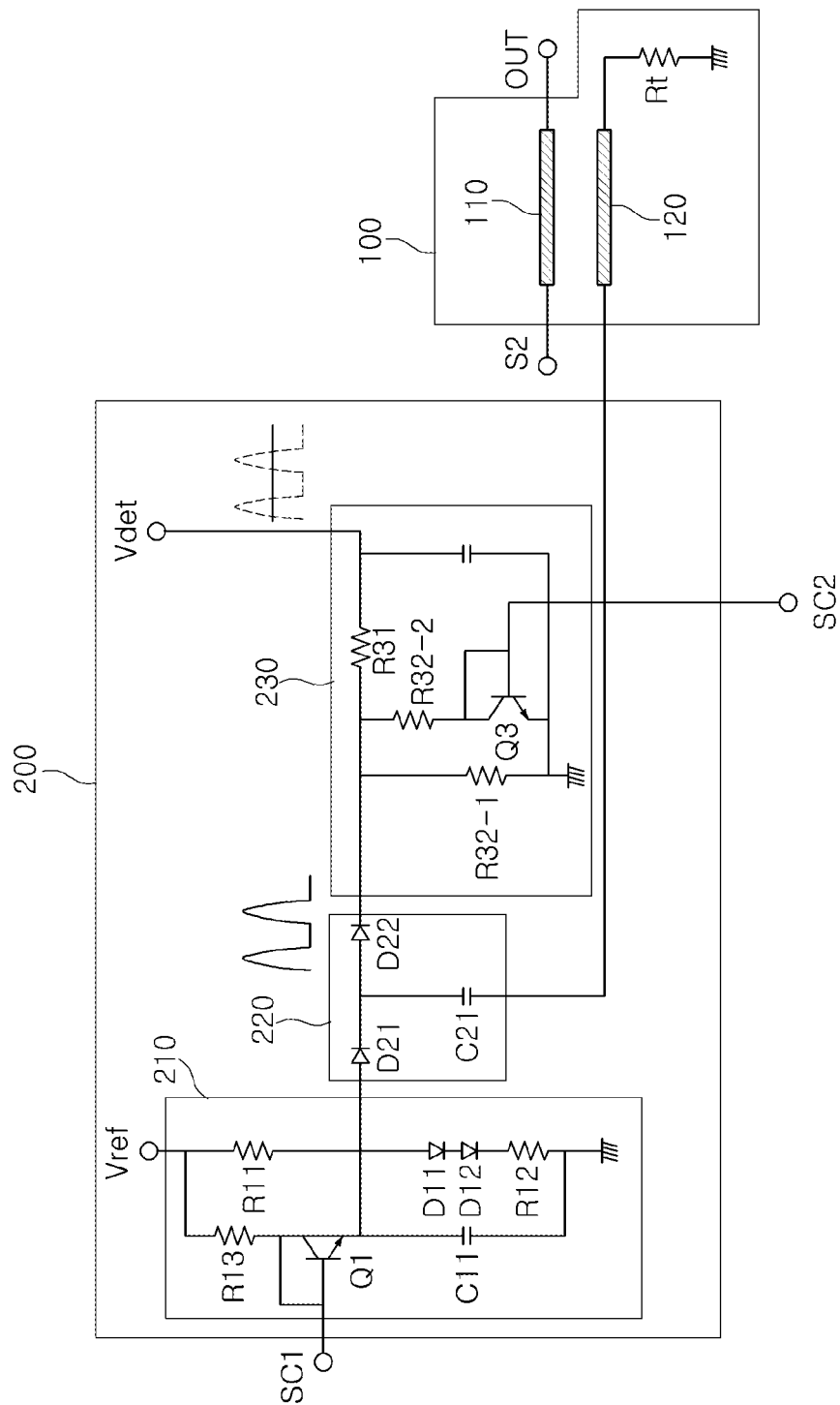
FIG. 6 is a detailed circuit diagram of a voltage detecting circuit of FIG. 5.

FIG. 6 is a detailed circuit diagram of a voltage detecting circuit of FIG. 5.

Referring to FIG. 6, the voltage detecting circuit may include a signal extracting circuit 100 and a voltage detecting circuit 200.

The signal extracting circuit 100 may include a first conductive line 110 connected between the power amplifier 60 and an output terminal OUT and a second conductive line 120 coupled to the first conductive line 110 to provide the coupled signal SCP.

One end of the second conductive line 120, as an isolation port, is grounded through a resistor Rt for impedance matching, and the other end of the second conductive line 120, as an extraction port, is connected to the voltage detecting circuit 200. Here, the isolation port is a port grounded through the resistor according to line impedance (generally, about 50 ohm) and not used for input/output. Although power is not transmitted to the isolation port, leakage power is reflected and not returned through the resistor, leakage power may be consumed as heat through the resistor, and the isolation port may be used for power stabilization.

The voltage detecting circuit 200 may include a bias circuit 210, a rectifier 220, and a filter 230.

In the bias circuit 210, at least two first and second resistors R11 and R12 and temperature compensation diodes D11 and D12 are connected in series between a supply terminal of a reference voltage Vref and a ground, and a third resistor R13 and a switch transistor Q1 may be connected to the first resistor R11 in parallel.

When the switch transistor Q1 is turned on in response to the first control signal SC1, the third resistor R13 is connected to the first resistor R11 in parallel, and thus, an equivalent resistance level is reduced to be smaller than a resistance level of the first resistor R11. A capacitor C11 is connected between an output node of a bias voltage Vbias and a ground to stabilize a voltage.

The rectifier 220 is biased by the bias voltage Vbias to rectify a voltage of the coupled signal SCP to provide a rectified voltage Vret.

Here, the rectifier 220 may be configured as illustrated in FIGS. 3 through 5 but is not limited thereto.

In the filter 230, a resistor R31 is connected between the rectifier 220 and an output terminal of the filter 230 through which the detection voltage Vdet is output, a resistor R32-1 is connected between one end of the resistor R31 and a ground, a capacitor is connected between the other end of the resistor R31 and a ground, and a resistor R32-2 and a switch transistor Q3 may be connected to the resistor R32-1 in parallel.

When the switch transistor Q3 is turned on in response to the second control signal SC2, the resistor R32-2 is connected to the resistor R32-1 in parallel, and thus, an equivalent resistance level is reduced to be smaller than a resistance level of the resistor R32-1.

Figure 7:
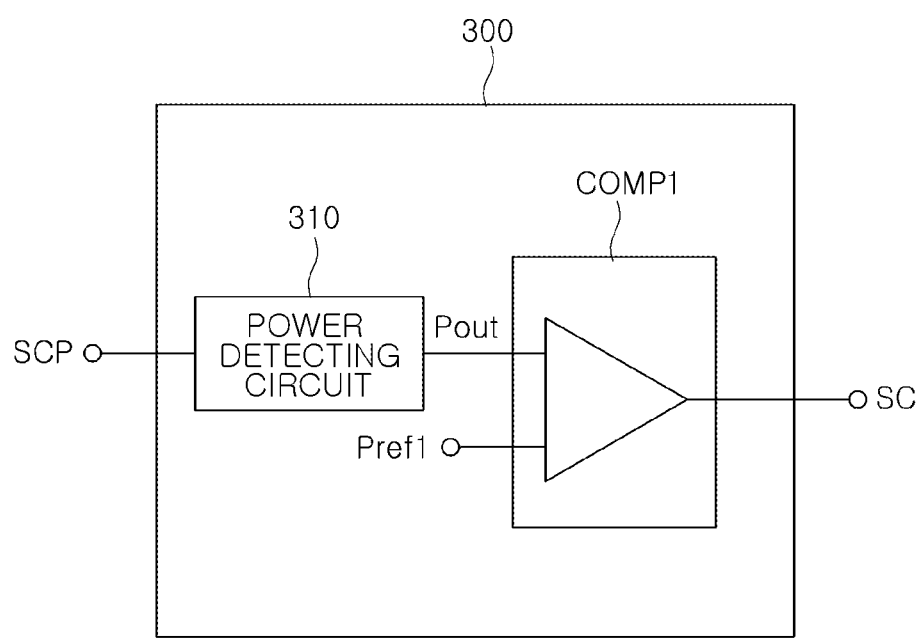
FIG. 7 is a view illustrating a first example of a detection voltage controller according to an embodiment.

FIG. 7 is a view illustrating a first example of a detection voltage controller according to an embodiment in the present disclosure.

Referring to FIG. 7, the detection voltage controller 300 may include a first comparator COMP1, and the first comparator COMP1 may compare output power Pout from the power amplifier 60 with a first reference value Pref1 and output the control signal SC having a voltage level based on the comparison result.

Figure 8:
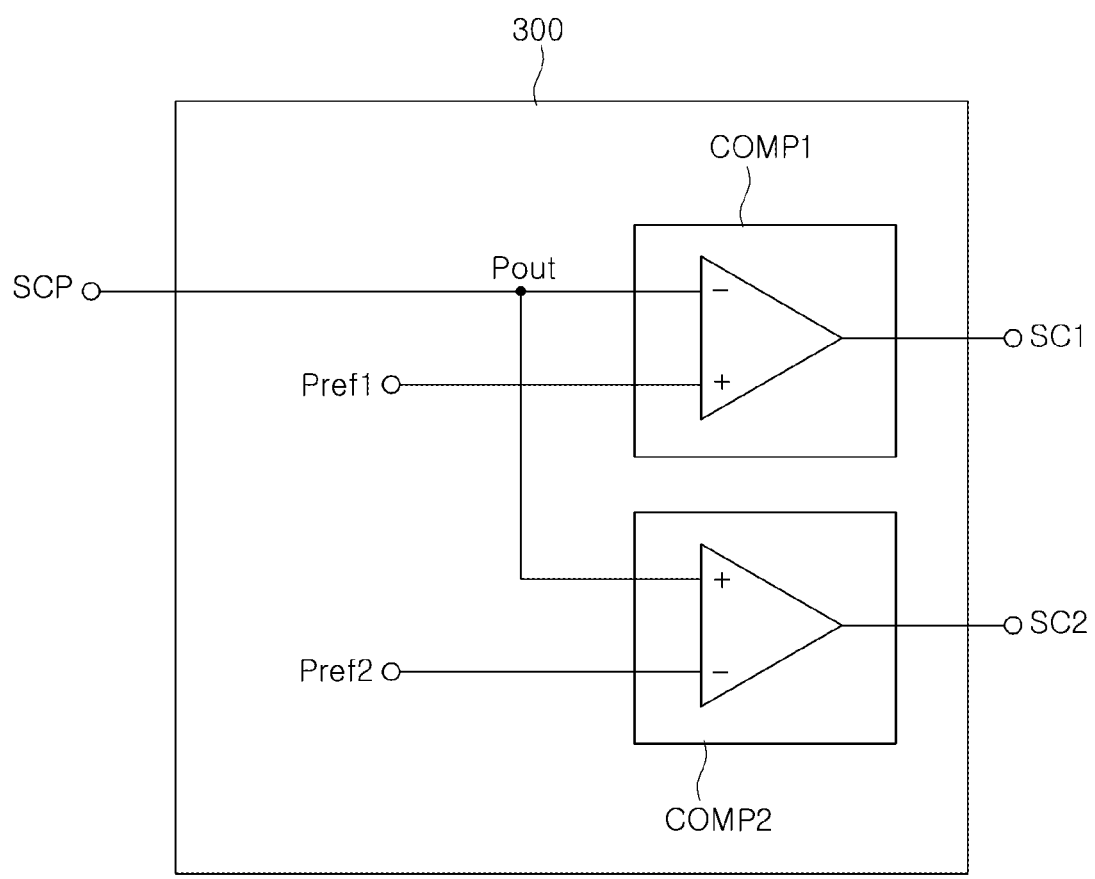
FIG. 8 is a view illustrating a second example of a detection voltage controller according to an embodiment.

FIG. 8 is a view illustrating a second example of a detection voltage controller according to an embodiment.

Referring to FIG. 8, the detection voltage controller 300 may include a first comparator COMP1 and a second comparator COMP2.

The first comparator COMP1 may compare the output power Pout from the power amplifier 60 with a first reference value Pref1 and output a first control signal SC1 having a voltage level based on the comparison result.

The second comparator COMP2 may compare the output power Pout from the power amplifier 60 with a second reference value Pref2 and output a second control signal SC2 having a voltage level based on the comparison result.

Here, the control signal SC may include the first control signal SC1 and the second control signal SC2.

FIG. 9 is a graph illustrating a Vdet-Pout relationship according to offset adjustment according to an embodiment.

Referring to the detection voltage Vdet-output power Pout graph illustrated in FIG. 9, as described above, it can be seen that, when a resistance level of at least one of the at least two dividing resistors is varied in the bias circuit 210, an offset regarding the detection value Vdet may be adjusted.

For example, in the bias circuit 210, when resistance is varied such that the bias voltage Vbias is lowered, an offset may be lowered, and the offset may be adjusted conversely.

FIG. 10 is a graph illustrating a Vdet-Pout relationship according to gradient adjustment according to an embodiment.

Referring to the detection voltage Vdet-output power Pout graph illustrated in FIG. 10, as described above, it can be seen that, when impedance of at least one of the at least two filter elements is varied in the filter 230, a gradient regarding the detection voltage Vdet may be adjusted.

For example, when resistance is varied such that the detection voltage Vdet is lowered in the filter 230, a gradient level thereof may be relatively lowered, or in other cases, a gradient level thereof may be adjusted to become high.

As set forth above, according to embodiments disclosed herein, a detection voltage may be varied in response to an input control signal. For example, at least one of an offset and a gradient regarding the detection voltage may be varied, and thus, the present disclosure may be applied to different types of RF ICs and an application range of the RF IC may be extended.

The apparatuses, units, modules, devices, and other components (e.g., the amplifier 60, signal extracting circuit 100, voltage detecting circuit 200, detection voltage controller 300, rectifier 220, bias circuit 210, RF circuit 50, and filter unit 230) illustrated in FIGS. 1-8 that perform the operations described herein are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the detailed descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While embodiments have been shown and described above, it will be apparent to those skilled in the art that modifications and variations could be made without departing from the scope of the present invention as defined by the appended claims.

What is claimed is:

1. A voltage detecting apparatus comprising:
a signal extracting circuit configured to extract a coupled signal from a signal output by a power amplifier configured to amplify a signal output by a radio frequency (RF) circuit;
a detection voltage controller configured to generate a control signal dependent on the coupled signal; and
a voltage detecting circuit configured to detect a detection voltage from the coupled signal and provide the detection voltage to the RF circuit dependent on the generated control signal,
wherein the voltage detecting circuit varies the detection voltage in response to the generated control signal input to the voltage detecting circuit.

2. The voltage detecting apparatus of claim 1, wherein the voltage detecting circuit comprises:
a bias circuit configured to divide a reference voltage through at least two dividing resistors to provide a bias voltage, a resistance level of at least one of the at least two dividing resistors being varied in response to a first control signal of the control signal;
a rectifier biased by the bias voltage and configured to rectify a voltage of the coupled signal and to provide the rectified voltage; and
a filter configured to filter the rectified voltage and to provide the detection voltage.

3. The voltage detecting apparatus of claim 1, wherein the voltage detecting circuit comprises:
a bias circuit configured to divide a reference voltage through at least two dividing resistors to provide a bias voltage;
a rectifier biased by the bias voltage to rectify a voltage of the coupled signal and to provide the rectified voltage; and
a filter configured to filter the rectified voltage through at least two filter elements to provide the detection voltage, impedance of at least one of the at least two filter elements being varied in response to a second control signal of the control signal.

4. A voltage detecting apparatus comprising:
a signal extracting circuit configured to extract a coupled signal from a signal output by a power amplifier configured to amplify a signal output by a radio frequency (RF) circuit; and
a voltage detecting circuit configured to detect a detection voltage from the coupled signal and to provide the detection voltage to the RF circuit,
wherein the voltage detecting circuit varies the detection voltage in response to a control signal input to the voltage detecting circuit, and wherein the voltage detecting circuit comprises:
a bias circuit configured to divide a reference voltage through at least two dividing resistors to provide a bias voltage, one of the at least two dividing resistors being varied in response to a first control signal of the control signal;
a rectifier biased by the bias voltage and configured to rectify a voltage of the coupled signal and provide the rectified voltage; and
a filter configured to filter the rectified voltage through at least two filter elements to provide the detection voltage, one of the at least two filter elements being varied in response to a second control signal of the control signal.

5. A power amplifier apparatus comprising:
a radio frequency (RF) circuit configured to process an input signal;
a power amplifier configured to amplify a signal output by the RF circuit;
a signal extracting circuit configured to extract a coupled signal from a signal output by the power amplifier;
a detection voltage controller configured to generate a control signal dependent on the coupled signal; and
a voltage detecting circuit configured to detect a detection voltage from the coupled signal and provide the detection voltage to the RF circuit dependent on the generated control signal, wherein the voltage detecting circuit is configured to vary the detection voltage in response to the generated control signal input to the voltage detecting circuit.

6. The power amplifier apparatus of claim 5, wherein the voltage detecting circuit comprises:
a bias circuit configured to divide a reference voltage through at least two dividing resistors to provide a bias voltage, a resistance level of at least one of the at least two dividing resistors being varied in response to a first control signal of the control signal;
a rectifier biased by the bias voltage and configured to rectify a voltage of the coupled signal and to provide the rectified voltage; and
a filter configured to filter the rectified voltage and to provide the detection voltage.

7. The power amplifier apparatus of claim 5, wherein the voltage detecting circuit comprises:
a bias circuit configured to divide a reference voltage through at least two dividing resistors to provide a bias voltage;
a rectifier biased by the bias voltage and configured to rectify a voltage of the coupled signal and to provide the rectified voltage; and
a filter configured to filter the rectified voltage through at least two filter elements to provide the detection voltage, impedance of at least one of the at least two filter elements being varied in response to a second control signal of the control signal.

8. The power amplifier apparatus of claim 5, wherein the voltage detecting circuit comprises:
a bias circuit configured to divide a reference voltage through at least two dividing resistors to provide a bias voltage, one of the at least two dividing resistors being varied in response to a first control signal of the control signal;
a rectifier biased by the bias voltage and configured to rectify a voltage of the coupled signal and to provide the rectified voltage; and
a filter configured to filter the rectified voltage through at least two filter elements to provide the detection voltage, one of the at least two filter elements being varied in response to a different second control signal of the control signal.

9. A power amplifier apparatus comprising:
a radio frequency (RF) circuit configured to process an input signal;
a power amplifier configured to amplify a signal output by the RF circuit;
a signal extracting circuit configured to extract a coupled signal from a signal output by the power amplifier;
a detection voltage controller configured to generate a control signal dependent on the coupled signal; and a voltage detecting circuit configured to detect a detection voltage from the coupled signal and provide the detection voltage to the RF circuit dependent on the generated control signal, wherein the voltage detecting circuit varies the detection voltage in response to the generated control signal input to the voltage detecting circuit.

10. The power amplifier apparatus of claim 9, wherein the detection voltage controller comprises a first comparator comparing power output by the power amplifier with a first reference value, and outputting the control signal having a voltage level according to the comparison result.

11. The power amplifier apparatus of claim 9, wherein the voltage detecting circuit comprises:
  a bias circuit configured to dividing a reference voltage through at least two dividing resistors to provide a bias voltage, a resistance level of at least one of the at least two dividing resistors being varied in response to a first control signal of the control signal;
  a rectifier biased by the bias voltage and configured to rectify a voltage of the coupled signal and to provide the rectified voltage; and
  a filter configured to filter the rectified voltage and to provide the detection voltage.

12. The power amplifier apparatus of claim 9, wherein the voltage detecting circuit comprises:
  a bias circuit configured to divide a reference voltage through at least two dividing resistors to provide a bias voltage;
  a rectifier biased by the bias voltage and configured to rectify a voltage of the coupled signal and to provide the rectified voltage; and
  a filter configured to filter the rectified voltage through at least two filter elements to provide the detection voltage, one of the at least two filter elements being varied in response to a second control signal of the control signal.

13. The power amplifier apparatus of claim 9, wherein the detection voltage controller comprises:
  a first comparator configured to compare power output by the power amplifier with a first reference value and to output a first control signal having a voltage level according to the comparison result, the control signal including the first control signal; and
  a second comparator configured to compare the power output by the power amplifier with a second reference value and to output a different second control signal having a voltage level according to the comparison result, the control signal including the second control signal.

14. The power amplifier apparatus of claim 13, wherein the voltage detecting circuit comprises:
  a bias circuit configured to divide a reference voltage through at least two dividing resistors to provide a bias voltage, one of the at least two dividing resistors being varied in response to the first control signal of the control signal;
  a rectifier biased by the bias voltage and configured to rectify a voltage of the coupled signal and to provide the rectified voltage; and
  a filter configured to filter the rectified voltage through at least two filter elements to provide the detection voltage, impedance of at least one of the at least two filter elements being varied in response to the second control signal of the control signal.

15. A method for controlling a voltage detecting apparatus comprising:

actuating an amplifier to accept an input signal received from an RF circuit and to output an amplified signal;
extracting a coupled signal from the amplified signal;
generating a control signal dependent on the coupled signal;
detecting a detection voltage from the coupled signal and providing the detection voltage to the RF circuit dependent on the generated control signal; and,
adaptively varying the detection voltage in response to the generated control signal input to the voltage detecting circuit.

16. The method as recited in claim 15, further comprising actuating a first comparator to compare the power output by the power amplifier with a first reference value, and outputting the control signal having a voltage level according to the comparison result.

17. The method as recited in claim 16, further comprising dividing a reference voltage through at least two dividing resistors to provide a bias voltage, a resistance level of at least one of the at least two dividing resistors being varied in response to the control signal;
  rectifying a voltage of the coupled signal and providing the rectified voltage; and
  filtering the rectified voltage to provide the detection voltage.

18. The method as recited in claim 15, embodied in a non-transitory computer readable medium.

19. A voltage detecting apparatus comprising:
  a signal extracting circuit configured to extract a coupled signal from a signal output by a power amplifier configured to amplify a signal output by a radio frequency (RF) circuit; and
  a voltage detecting circuit configured to detect a detection voltage from the coupled signal and provide the detection voltage to the RF circuit,
  wherein the voltage detecting circuit varies the detection voltage in response to a control signal input to the voltage detecting circuit, and
  wherein the voltage detecting circuit comprises a filter that includes a first resistance in series with a transistor that is provided the control signal, the first resistance and the transistor being further configured in parallel with a second resistance, so a resistance level of the filter is reduced when a first control signal of the control signal turns the transistor on to vary the detection voltage.

20. The voltage detecting apparatus of claim 19, wherein the filter further includes a third resistance arranged between an output of the voltage detecting circuit and the parallel arrangement of the first resistance, the transistor, and the second resistance, and the filter further includes a capacitance arranged between the output of the voltage detecting circuit and a ground.

21. The voltage detecting apparatus of claim 19, wherein the voltage detecting circuit further comprises:
  a bias circuit configured to divide a reference voltage through at least two dividing resistors to provide a bias voltage, one of the at least two dividing resistors being varied in response to a different second control signal of the control signal to alternately vary the detection voltage; and
  a rectifier biased by the bias voltage and configured to rectify a voltage of the coupled signal and to provide the rectified voltage to the filter.

22. The voltage detection apparatus of claim 19, further comprising a detection voltage controller configured to generate the control signal dependent on the coupled signal.

23. The voltage detection apparatus of claim 19, further comprising:
   the radio frequency (RF) circuit; and
   the power amplifier.

\* \* \* \* \*